(12) United States Patent
Mochizuki

(10) Patent No.: US 11,408,926 B2
(45) Date of Patent: Aug. 9, 2022

(54) ELECTRICAL CONNECTING DEVICE, INSPECTION APPARATUS, AND METHOD FOR ELECTRICAL CONNECTION BETWEEN CONTACT TARGET AND CONTACT MEMBER

(71) Applicant: TOKYO ELECTRON LIMITED, Tokyo (JP)

(72) Inventor: Jun Mochizuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 17/004,935

(22) Filed: Aug. 27, 2020

(65) Prior Publication Data

US 2021/0063465 A1 Mar. 4, 2021

(30) Foreign Application Priority Data

Sep. 3, 2019 (JP) .............................. JP2019-160439

(51) Int. Cl.
| | | |
|---|---|---|
| *G01R 31/26* | (2020.01) | |
| *G01R 31/28* | (2006.01) | |
| *G01R 1/04* | (2006.01) | |
| *G01R 1/067* | (2006.01) | |
| *G01R 1/073* | (2006.01) | |

(52) U.S. Cl.
CPC ..... *G01R 31/2601* (2013.01); *G01R 1/07342* (2013.01)

(58) Field of Classification Search
CPC .... G01R 31/02; G01R 31/26; G01R 31/2601; G01R 31/28; G01R 31/2887; G01R 1/04; G01R 1/067; G01R 1/073; G01R 1/07314
See application file for complete search history.

(56) References Cited

U.S. PATENT DOCUMENTS

| | | | |
|---|---|---|---|
| 6,468,098 B1* | 10/2002 | Eldridge | G01R 1/0735 439/197 |
| 2015/0145540 A1* | 5/2015 | Komatsu | G01R 31/2874 324/750.03 |
| 2018/0252765 A1* | 9/2018 | Nagashima | G01R 31/2887 |

FOREIGN PATENT DOCUMENTS

JP 2004-85260 A 3/2004

* cited by examiner

*Primary Examiner* — Neel D Shah
(74) *Attorney, Agent, or Firm* — Fenwick & West LLP

(57) ABSTRACT

An electrical connecting device having one or more contact members to be in contact with a contact target is provided. The electrical connecting device includes a main body having one or more recesses on a surface thereof opposed to the contact target, and a flexible portion that covers the recesses to form sealed spaces. The main body includes a gas exhaust passage and an air supply passage provided for each of the sealed spaces to adjust a pressure in each of the sealed spaces, and the contact members are respectively disposed to be opposed to the recesses with the flexible portion interposed therebetween.

8 Claims, 7 Drawing Sheets

ELECTRICAL CONNECTING DEVICE, INSPECTION APPARATUS, AND METHOD FOR ELECTRICAL CONNECTION BETWEEN CONTACT TARGET AND CONTACT MEMBER

CROSS-REFERENCE TO RELATED APPLICATION

This application claims priority to Japanese Patent Application No. 2019-160439, filed on Sep. 3, 2019, the entire contents of which are incorporated herein by reference.

TECHNICAL FIELD

The present disclosure relates to an electrical connecting device, an inspection apparatus, and a method for electrical connection between a contact target and a contact member.

BACKGROUND

Japanese Patent Application Publication No. 2004-85260 discloses a contactor including a plurality of probe pins and a support body for supporting the probe pins. In this contactor, each of the probe pins includes a main body having a contact terminal and a coil spring that is partially screwed into a spiral groove formed on an outer peripheral surface of the main body to be electrically integrated with the main body.

The technique of the present disclosure reduces the manufacturing cost of an electrical connecting device including a contact member to be in contact with a contact target.

SUMMARY

In accordance with an aspect of the present disclosure, there is provided an electrical connecting device having one or more contact members to be in contact with a contact target, including: a main body having one or more recesses on a surface thereof opposed to the contact target; and a flexible portion that covers the recesses to form sealed spaces. The main body includes a gas exhaust passage and an air supply passage provided for each of the sealed spaces to adjust a pressure in each of the sealed spaces, and the contact members are respectively disposed to be opposed to the recesses with the flexible portion interposed therebetween.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
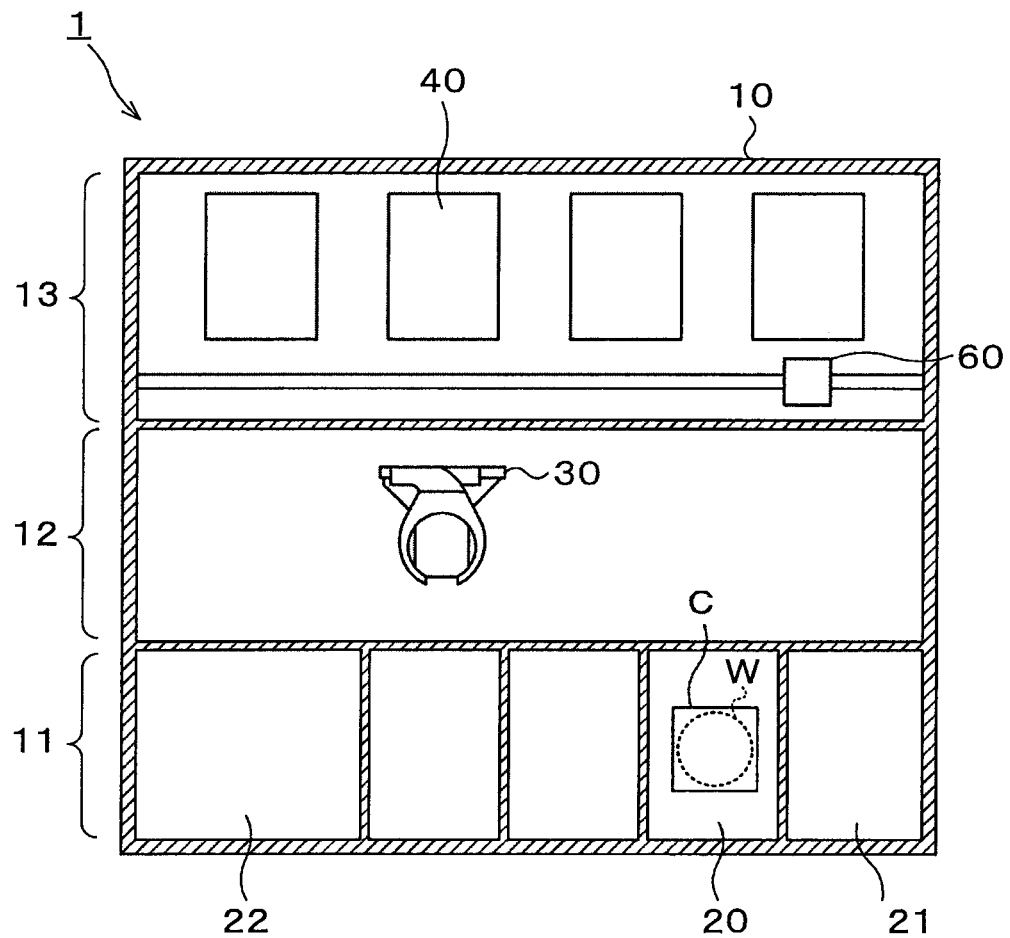
FIG. 1 is a horizontal cross-sectional view schematically showing a configuration of an inspection apparatus according to an embodiment.
Figure 1:
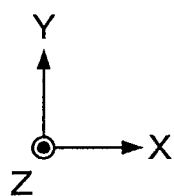

In a semiconductor manufacturing process, a plurality of semiconductor devices, each having a circuit pattern, is formed on a semiconductor wafer (hereinafter referred to as "wafer"). Electrical characteristics of the semiconductor devices formed on the wafer are inspected and the semiconductor devices are classified into non-defective products or defective products. For example, the semiconductor devices are inspected with an inspection apparatus before the wafer is divided into the semiconductor devices.

The inspection apparatus includes, e.g., a substrate support for placing thereon a wafer, and a probe card having a plurality of probes. In order to perform the electrical characteristic inspection, first, the wafer placed on the substrate support and the probe card are made to be close to each other, and the probes of the probe card are brought into contact with electrodes of the semiconductor devices formed on the wafer. In this state, a tester disposed above the probe card supplies electric signals to the semiconductor devices through the probes. Then, the defectiveness of the semiconductor devices is determined based on the electric signals transmitted from the semiconductor devices to the tester through the probes.

Japanese Patent Application Publication No. 2004-85260 discloses a probe including a main body having a contact terminal, and a coil spring that is partially screwed into a spiral groove formed on an outer peripheral surface of the main body to be electrically integrated. By using an elastic structure such as the coil spring or the like, the probe can be stably brought into contact with an electrode of a semiconductor device at an appropriate pressure. Since, however, a long period of time is required to manufacture a probe card having the probe provided with the coil spring, the manufacturing cost increases. Especially, when a large number of probes are provided, the manufacturing cost further increases.

The drawback related to the manufacturing cost also occurs in other electrical connecting devices having contact members other than the probe card.

Therefore, the present disclosure provides a technique capable of reducing the manufacturing cost of the electrical connecting device having a contact member to be in contact with a contact target.

Hereinafter, an electrical connecting device, an inspection apparatus, and a method for electrical connection between a contact target and a contact member according to the present embodiment will be described with reference to the drawings. Like reference numerals will be given to like parts having substantially the same functions and configurations throughout the specification and the drawings, and redundant description thereof will be omitted.

Figure 2:
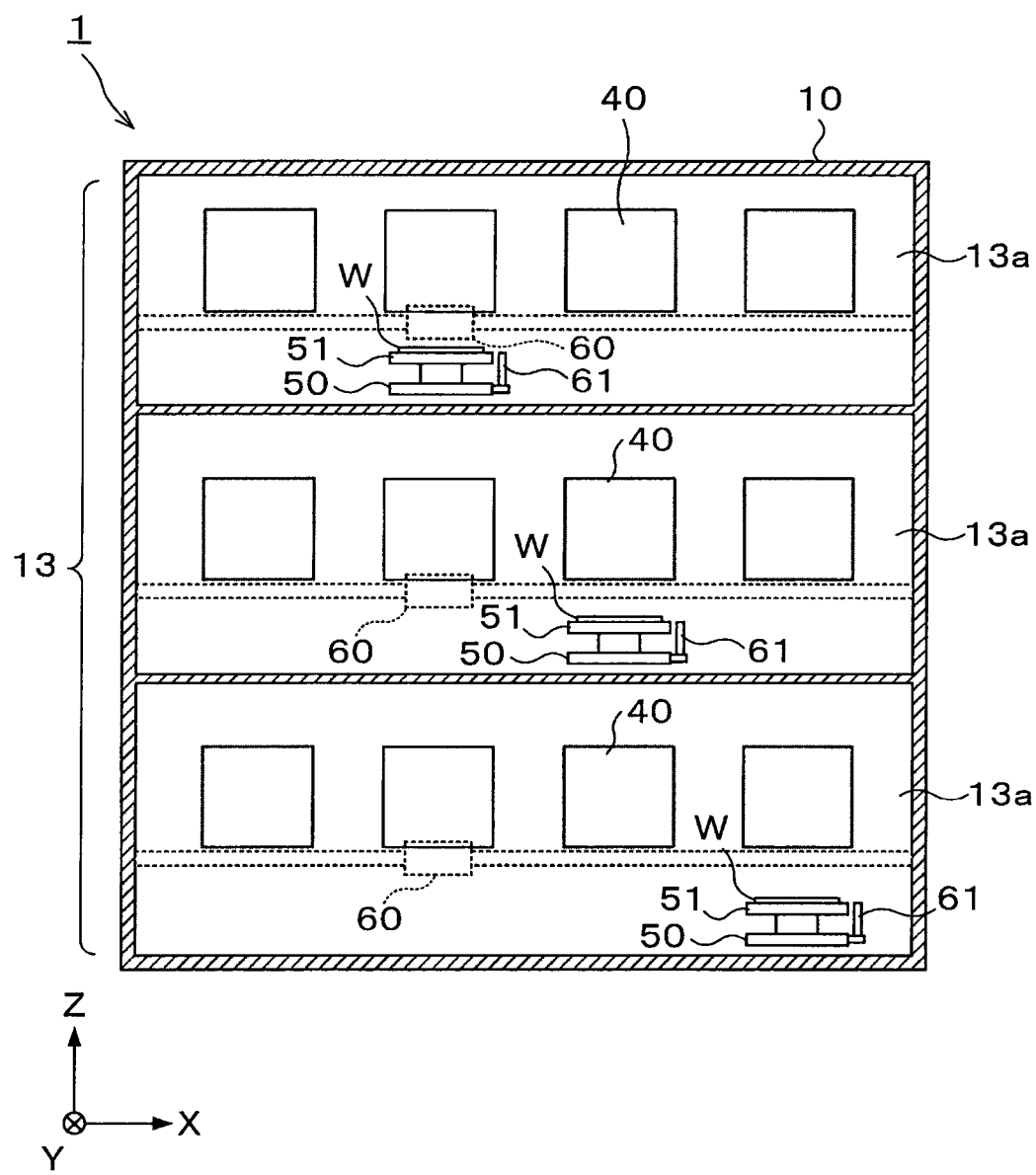
FIG. 2 is a vertical cross-sectional view schematically showing the configuration of the inspection apparatus according to the embodiment.

FIGS. 1 and 2 are a horizontal cross-sectional view and a vertical cross-sectional view, respectively, each schematically showing a configuration of an inspection apparatus of the present embodiment.

As shown in FIGS. 1 and 2, an inspection apparatus 1 includes a housing 10 having a loading/unloading area 11, a transfer area 12, and an inspection area 13. In the loading/unloading area 11, the wafer W as a contact target and an inspection target substrate is loaded into and unloaded from the inspection apparatus 1. The transfer area 12 is formed to connect the loading/unloading area 11 and the inspection area 13. In the inspection area 13, electrical characteristics of semiconductor devices that are inspection target devices formed on the wafer W are inspected.

The loading/unloading area 11 has therein a port 20 for receiving a cassette C containing a plurality of wafers W, a loader 21 accommodating a contactor to be described later, and a controller 22 for controlling individual components of the inspection apparatus 1. The controller 22 is, e.g., a computer including a CPU, a memory, and the like, and includes a program storage unit (not shown). The program storage unit is configured to store programs for controlling various processes in the inspection apparatus 1. The programs may be stored in a computer-readable storage medium and installed in the controller 22 from the storage medium. A part of or all of the programs may be realized by a dedicated hardware (circuit board).

A transfer unit 30 configured to be movable while holding the wafer W or the like is disposed in the transfer area 12. The transfer unit 30 transfers the wafer W between the cassette C in the port 20 of the loading/unloading area 11 and the inspection area 13. Further, the transfer unit 30 transfers, among contactors fixed to a pogo frame to be described later in the inspection area 13, a contactor requiring maintenance to the loader 21 in the loading/unloading area 11. In addition, the transfer unit 30 transfers a new contactor or a contactor that has been subjected to maintenance from the loader 21 to the pogo frame in the inspection area 13.

A plurality of testers 40 is disposed in the inspection area 13. Specifically, as shown in FIG. 2, the inspection area 13 is vertically divided into three areas 13*a*, and four testers 40 are horizontally arranged in a row (X direction in FIG. 2) in each of the vertically divided 13*a*. One aligner 50 and one camera 60 are disposed in each of the vertically divided area 13*a*. The number and arrangement of the testers 40, the number and arrangement of the aligner 50, and the number and arrangement of the camera 60 may be arbitrarily selected.

Each of the testers 40 transmits and receives electric signals for electrical characteristic inspection to and from the wafer W.

The aligner 50 is configured to move a chuck top 51 to be described later serving as a substrate support for placing thereon the wafer W. The aligner 50 is movable below the tester 40. Specifically, the aligner 50 on which the chuck top 51 is placed is movable in a vertical direction (Z direction in FIG. 2), a forward-backward direction (Y direction in FIG. 2), and a right-left direction (X direction in FIG. 2). Therefore, the aligner 50 serves as a position adjusting mechanism for adjusting the position between the chuck top 51 and the contactor. Further, the aligner 50 can detachably hold the chuck top 51 by vacuum attraction force or the like and is provided with a camera 61 for capturing an image of the contactor.

The camera 60 moves horizontally and reaches a position in front of each tester 40 in the vertically divided area 13*a* where the camera 60 is disposed so as to capture an image of the wafer W placed on the chuck top 51 on the aligner 50.

The position alignment of the spherical contact members of the contactor to be described later with the electrode pads of the semiconductor devices formed on the wafer W can be performed by the cooperative operation of the cameras 60 and 61.

In the inspection apparatus 1, while the transfer unit 30 is transferring the wafer W toward one tester 40, another tester 40 can inspect the electrical characteristics of the electronic devices (e.g., semiconductor devices) formed on another wafer W.

Figure 3:
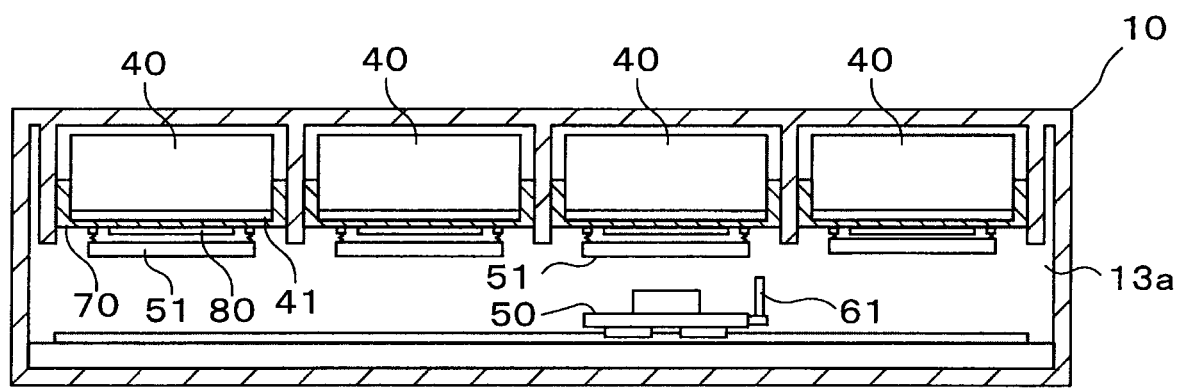
FIG. 3 is a vertical cross-sectional view showing a configuration in a divided area.
Figure 4:
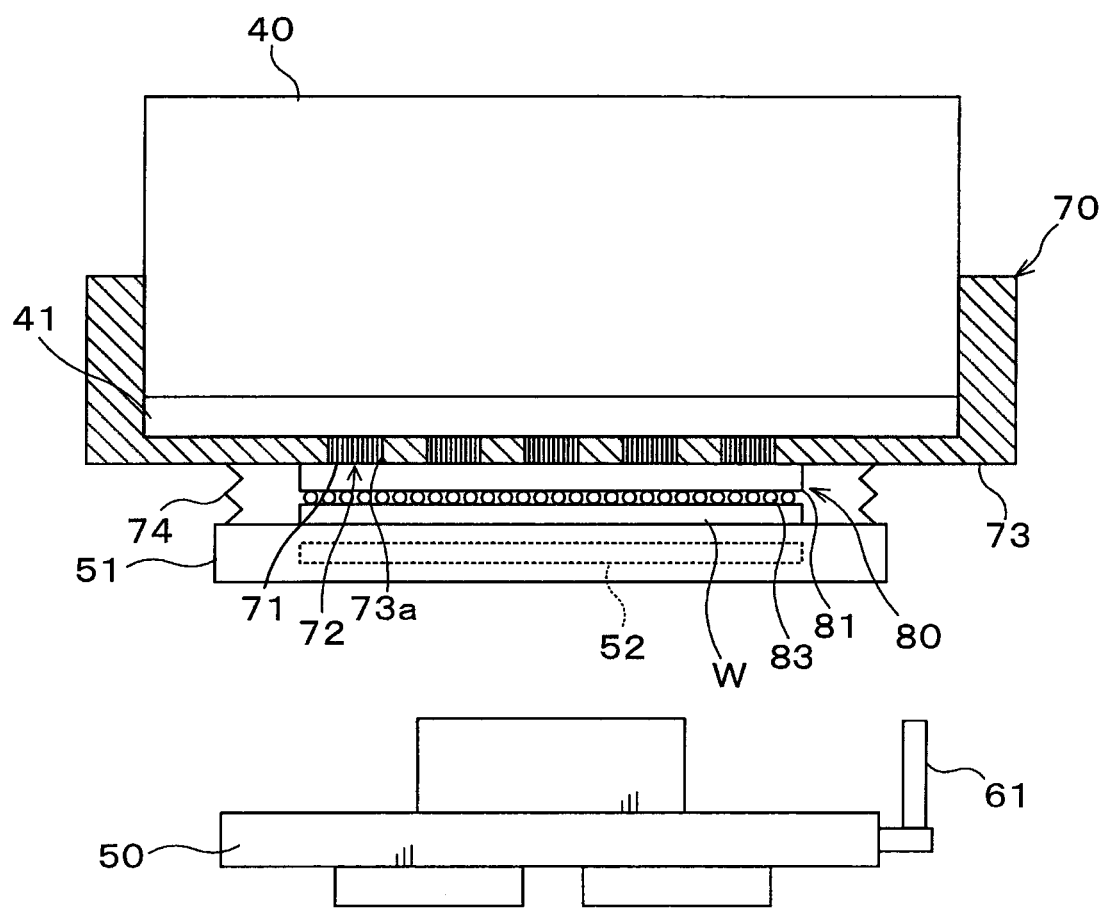
FIG. 4 is a partially enlarged view of FIG. 3.
Figure 5:
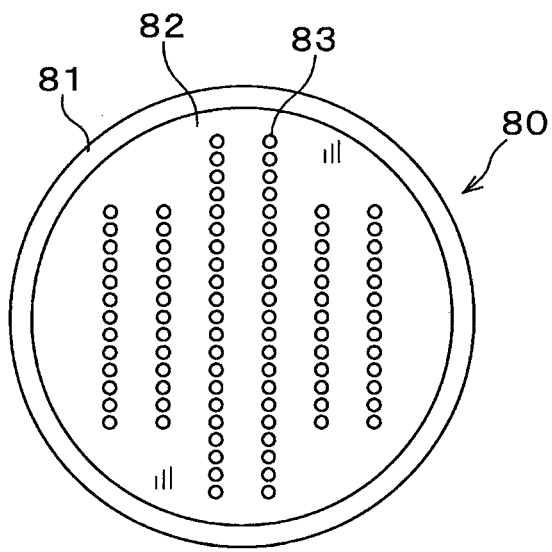
FIG. 5 is a plan view showing a schematic configuration of a contactor.
Figure 6:
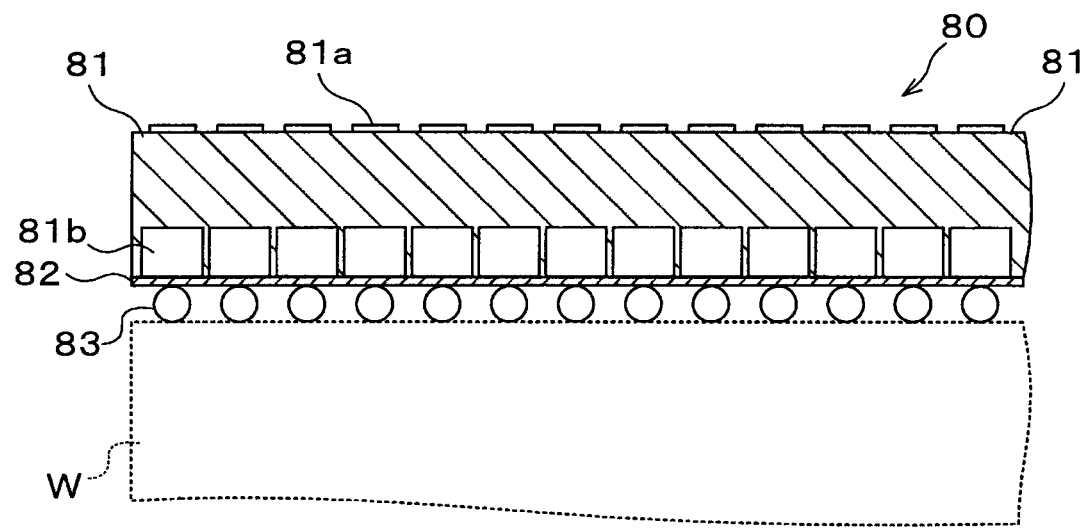
FIG. 6 is a vertical cross-sectional view showing the schematic configuration of the contactor.
Figure 7:
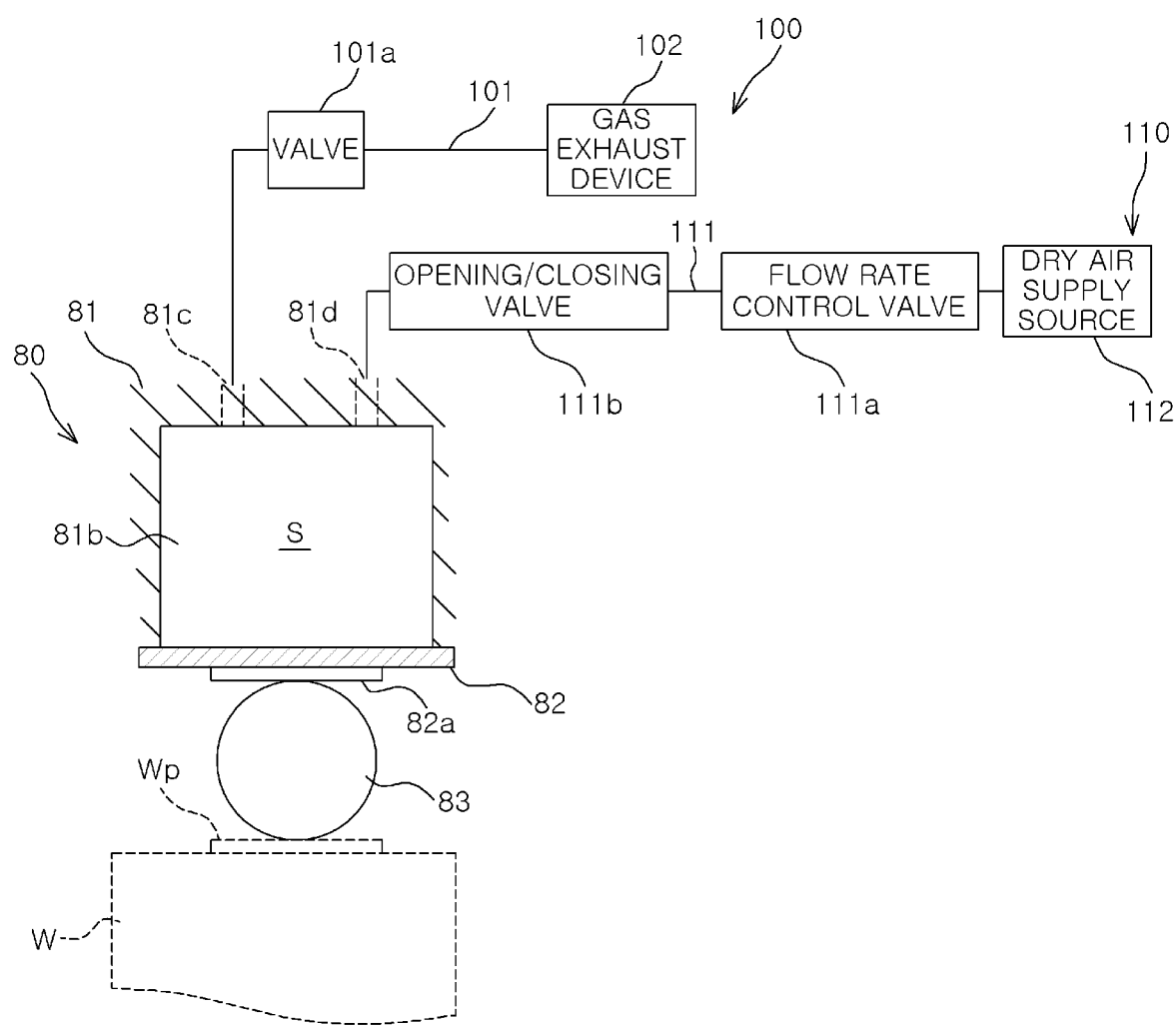
FIG. 7 is an enlarged view of the main parts of the contactor.

Next, a configuration around the tester 40 will be described with reference to FIGS. 3 to 7. FIG. 3 is a vertical cross-sectional view schematically showing a configuration in each divided area 13*a*. FIG. 4 is a partially enlarged view of FIG. 3. FIGS. 5 and 6 are a plan view and a vertical cross-sectional view, respectively, showing a schematic configuration of the contactor disposed below the tester 40. FIG. 7 is an enlarged view of the main parts of the contactor.

As shown in FIGS. 3 and 4, the tester 40 has a tester motherboard 41 that is horizontally disposed on the bottom surface of the tester 40. A plurality of test circuit boards (not shown) is mounted upright on the tester motherboard 41. A plurality of electrodes is disposed at the bottom surface of the tester motherboard 41.

One pogo frame 70 and one contactor 80 are disposed under the tester 40, in that order, from the upper side.

The pogo frame 70 supports the contactor 80 and electrically connects the contactor 80 with the tester 40. The pogo frame 70 is disposed between the tester 40 and the contactor 80. The pogo frame 70 has multiple pogo pins 71 for electrically connecting the contactor 80 with the tester 40. Specifically, the pogo frame 70 has pogo blocks 72 holding the pogo pins 71. Further, the pogo frame 70 includes a frame main body 73 having insertion holes 73*a* into which the pogo blocks 72 holding the pogo pins 71 are inserted.

The contactor 80 whose position has been aligned with respect to the pogo frame 70 is supported on the bottom surface of the pogo frame 70.

A bellows 74 serving as a support for a substrate support that can extend and contract in a vertical direction is attached to the bottom surface of the pogo frame 70 to surround a position where the contactor 80 is attached. The bellows 74 is provided to form a sealed space including the contactor 80 and the wafer W in a state where the wafer W on the chuck top 51 to be described later is in contact with spherical contact members 83 (to be described later) of the contactor 80 during the electrical characteristic inspection.

By using a gas exhaust unit (not shown), the tester motherboard 41 is coupled to the pogo frame 70 by vacuum attraction force and the contactor 80 is coupled to the pogo frame 70 by vacuum attraction force. Due to the vacuum attraction force, the lower ends of the pogo pins 71 of the pogo frame 70 are brought into contact with the corresponding electrode pads on the top surface of a card main body 81 (to be described later) of the contactor 80, and the upper ends of the pogo pins 71 are pressed against the corresponding electrodes on the bottom surface of the tester motherboard 41.

The chuck top 51 is held below the contactor 80, supported on the bottom surface of the pogo frame 70, through the bellows 74.

When the wafer W is placed on the chuck top 51, the wafer W is attracted and held on the chuck top 51. A temperature control mechanism 52 is embedded in the chuck top 51. The temperature control mechanism 52 is configured to control the temperature of the wafer W placed on the chuck top 51 by controlling the temperature of the chuck top 51 at the time of the electrical characteristic inspection.

At the time of the electrical characteristic inspection, the chuck top 51 on which the wafer W is placed is raised by the aligner 50 and the spherical contact members to be described later of the contactor 80 are brought into contact with the wafer W.

Further, at the time of the electrical characteristic inspection, by raising the chuck top 51, the bottom surface of the bellows 74 is brought into contact with the chuck top 51 through a sealing member (not shown), and an inspection space defined by the chuck top 51, the pogo frame 70 and the bellows 74 becomes a sealed space. By evacuating the inspection space, releasing the holding of the chuck top 51, and moving the aligner 50 downward, the chuck top 51 is separated from the aligner 50 and coupled to the pogo frame 70 by vacuum attraction force.

The contactor 80 electrically connects the pogo frame 70 serving as an electrical connection source and the wafer W serving as an electrical connection destination. As shown in FIGS. 5 to 7, the contactor 80 includes a card main body 81 as a main body, a flexible printed circuit (FPC) board 82 as a flexible portion, and the spherical contact member 83 as a contact member.

The card main body 81 is, e.g., a laminated wiring board such as an organic multilayer board or a ceramic multilayer board, and has a disc shape. The card main body 81 has a conductive path including a plurality of electrode pads 81a disposed on the top surface of the card main body 81. The conductive path is electrically connected to the pogo frame 70. Further, a plurality of recesses 81b is formed on the bottom surface of the card main body 81, i.e., the surface of the card main body 81 that is opposed to the wafer W, at positions corresponding to electrode pads Wp of the wafer W. The recesses 81b have, e.g., a length and a width of 10 μm to 1000 μm and a depth of 10 μm to 1000 μm.

A gas exhaust passage 81c and an air supply passage 81d of the card main body 81 will be described later.

The FPC board 82 is a flexible printed circuit board and uses, e.g., a member made of polyimide as a base material. The FPC board 82 has a conductive path including electrode pads 82a that are formed on the bottom surface of the FPC board 82 at positions corresponding to the recesses 81b. The conductive path electrically connects the conductive path of the card main body 81 and the spherical contact members 83. Further, the recesses 81b of the card main body 81 are covered by the FPC board 82. Thus, sealed spaces S between the FPC board 82 and the respective recesses 81b are formed.

The spherical contact members 83 are brought into contact with the electrode pads Wp of the semiconductor devices of the wafer W at least at the time of inspection. The electrodes of the wafer W may be provided with solder bumps instead of the electrode pads Wp.

Each spherical contact member 83 has a spherical shape and is made of, e.g., solder. For example, when the electrode pads Wp of the wafer W have a dimension of 30 μm×30 μm, the diameter of the spherical contact member 83 is set to 5 μm to 200 μm.

The spherical contact members 83 are disposed to be opposed to the recesses 81b of the card main body 81 with the FPC board 82 interposed therebetween. Specifically, the spherical contact members 83 are disposed on the electrode pads 82a that are formed on the FPC board 82 at positions corresponding to the recesses 81b of the card main body 81.

Further, the spherical contact members 83 are electrically connected to the corresponding electrode pads 81a disposed on the top surface of the card main body 81 through the conductive path of the FPC board 82. Therefore, at the time of the electrical characteristic inspection, electric signals are transmitted and received between the tester motherboard 41 and the semiconductor devices on the wafer W through the pogo pins 71, the electrode pads 81a formed on the top surface of the card main body 81, and the spherical contact members 83.

In the inspection apparatus 1, the plurality of spherical contact members 83 is disposed to cover substantially the entire bottom surface of the contactor 80 in order to collectively inspect the electrical characteristics of the semiconductor devices formed on the wafer W, and the plurality of recesses 81b is disposed to correspond thereto.

Hereinafter, the card main body 81 will be described. The card main body 81 is provided with the gas exhaust passage 81c and the air supply passage 81d for each of the sealed space S to adjust the pressure in each of the sealed spaces S formed by the recesses 81b and the FPC board 82. The gas exhaust passages 81c provided for the sealed spaces have one ends respectively communicating with the recesses 81b and the other ends connected to a gas exhaust mechanism 100. Further, the air supply passages 81d provided for the sealed spaces have one ends respectively communicating with the recesses 81b and the other ends connected to an air supply mechanism 110. Both of the gas exhaust mechanism 100 and the air supply mechanism 110 are pressure adjusting mechanisms for adjusting the pressures in the sealed spaces S.

The gas exhaust mechanism 100 includes a gas exhaust line 101 and a gas exhaust device 102. The gas exhaust line 101 has one end connected to the gas exhaust passages 81c and the other end connected to the gas exhaust device 102. The gas exhaust device 102 is, e.g., a vacuum pump, and exhausts a gas from each of the sealed spaces S formed by the FPC board 82 and the recesses 81b of the card main body 81. Further, the gas exhaust line 101 is provided with a valve 101a. As an example of the valve 101a, a valve whose opening degree can be adjusted is used.

The air supply mechanism 110 includes a supply line 111 and a dry air supply source 112. The supply line 111 has one end connected to the air supply passages 81d and the other end connected to the dry air supply source 112. The dry air supply source 112 supplies dry air to the sealed spaces S. Further, the supply line 111 is provided with a flow rate control valve 111a and an opening/closing valve 111b disposed in that order from the upstream side.

Next, the inspection process using the inspection apparatus 1 will be described with reference to FIGS. 8 to 11. FIGS. 8 to 11 are cross-sectional views showing a configuration around the spherical contact member 83 at the time of the inspection process, and show only portions related to the inspection process. In the following description, the inspection process is started when the chuck tops 51 on which the wafers W are not placed are attached to all the testers 40, i.e., all the pogo frames 70.

(Alignment)

Figure 8:
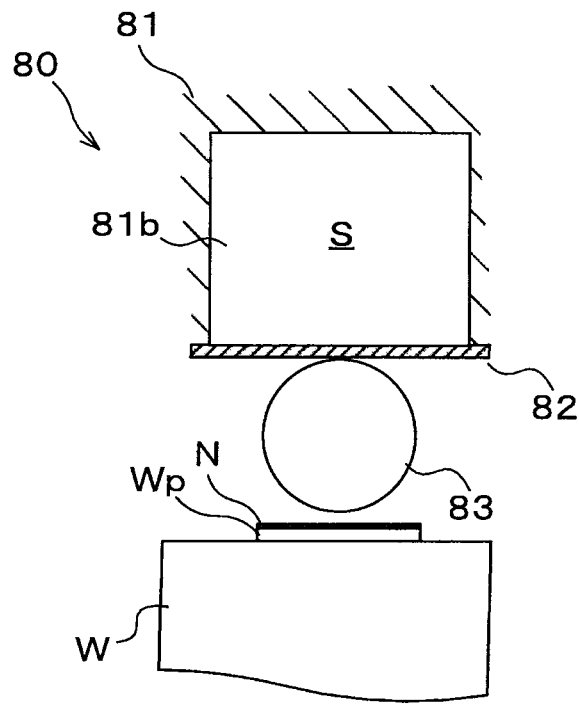
FIGS. 8 to 11 are vertical cross-sectional views showing a configuration around a spherical contact member during an inspection process.

First, the wafer W as an inspection target and the contactor 80 are aligned. Specifically, the controller 22 controls the transfer unit 30 or the like to transfer the wafer W from the cassette C in the port 20 of the loading/unloading area 11 into the inspection area 13 and place the wafer W on the chuck top 51 on the aligner 50. Next, the controller 22 controls the aligner 50 and the cameras 60 and 61 to capture an image of the wafer W using the camera 60 and images of the spherical contact members 83 using the camera 61. The horizontal position alignment between the wafer W on the chuck top 51 and the contactor 80 is performed based on the imaging results. Then, as shown in FIG. 8, for example, the chuck top 51 is raised until the distance between the spherical contact members 83 of the contactor 80 and the electrode pads Wp of the semiconductor devices formed on the wafer W becomes a predetermined distance. At this stage, the electrode pads Wp of the semiconductor devices are covered with insulating layers N, respectively. Then, the gas exhaust mechanism (not shown) is driven and the aligner 50 is lowered, so that the chuck top 51 is separated from the aligner 50 and coupled to the pogo frame 70 by vacuum attraction force. The spherical contact members 83 and the electrode pads Wp may be brought into contact with each other during the alignment process.

(Electrical Connection)

Next, the electrode pads Wp of the semiconductor devices on the wafer W and the spherical contact members 83 are electrically connected.

Specifically, first, the gas exhaust mechanism 100 and the air supply mechanism 110 are driven to adjust the pressures in the sealed spaces S formed by the recesses 81*b* of the card main body 81 and the FPC board 82, and the insulating layers N on the electrode pads Wp are destroyed by repeated collision with the spherical contact members 83.

Figure 9:
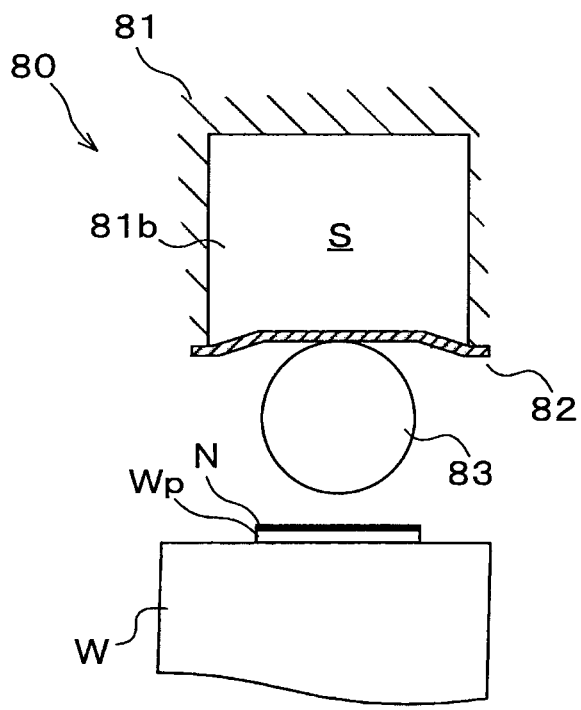
Figure 10:
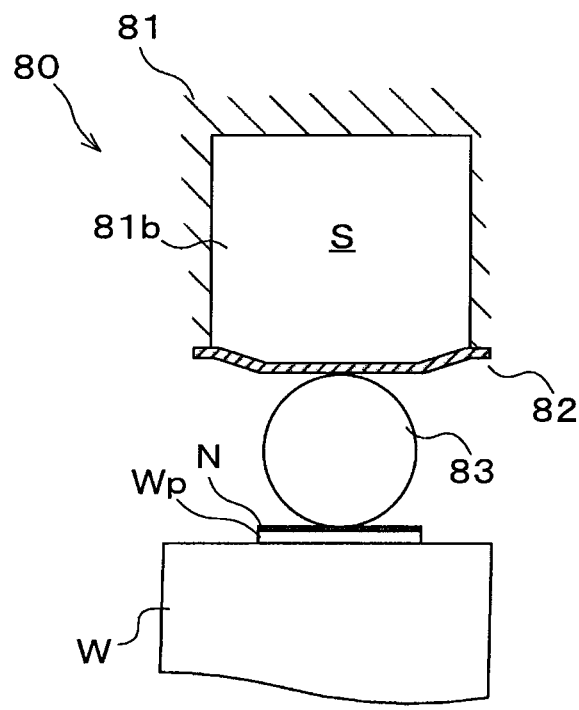
Figure 11:
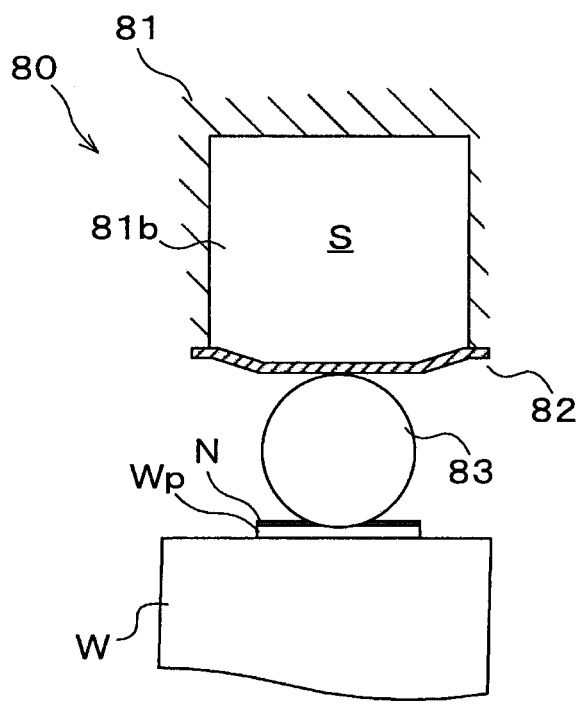

More specifically, the gas exhaust operation is started by the gas exhaust mechanism 100 to decrease the pressures in the sealed spaces S. Thus, as shown in FIG. 9, the FPC board 82 is deformed to protrude toward the recesses 81*b*, and the spherical contact members 83 are further separated from the electrode pads Wp, respectively. Next, the gas exhaust operation of the gas exhaust mechanism 100 is stopped and the air supply operation of the air supply mechanism 110 is started to increase the pressures in the sealed spaces S. Accordingly, as shown in FIG. 10, the FPC board 82 is deformed to protrude toward the wafer W, and the spherical contact members 83 collide with the insulating layers N on the electrode pads Wp, respectively. The insulating layers N are destroyed by repeating the separation of the spherical contact members 83 from the electrode pads Wp and the collision of the spherical contact members 83 with the electrode pads Wp, i.e., repeating the contact and the non-contact of the spherical contact members 83 with the electrode pads Wp.

After at least a part of each of the insulating layers N is destroyed or removed, the air supply mechanism 110 is driven, for example, to adjust the pressures in the sealed spaces S. Thus, as shown in FIG. 10, the spherical contact members 83 are brought into contact with the electrode pads Wp by a desired load, and they are electrically connected to each other. On the assumption that the pressure in each of the sealed spaces S at the time of making the spherical contact member 83 collide with the insulating layer N to destroy the insulating layer N is set to P1 and the pressure in each of the sealed spaces S at the time of electrically connecting the spherical contact member 83 and the electrode pad Wp after the insulating layer is destroyed, i.e., the pressure in each of the sealed spaces S at the time of inspection, is set to P2, the condition of P1≈P2 or P1≥P2 is satisfied. The pressures in the sealed spaces S are adjusted by controlling the opening degree of the flow rate control valve 111*a* of the air supply mechanism 110 or the valve 101*b* of the gas exhaust mechanism 100 based on the pressures in the sealed spaces S measured by pressure gauges (not shown), for example.

(Inspection)

After the electrical connection, electric signals for inspecting electric characteristics are inputted from the tester 40 to the spherical contact members 83 through the pogo pins 71 and the like, and the inspection of electrical characteristics of electronic devices (e.g. the semiconductor devices) is started.

When the inspection of the electrical characteristics is completed, the controller 22 controls the aligner 50, the transfer device 30, or the like. Accordingly, the separation of the chuck top 51 from the pogo frame 70, i.e., the dechucking of the chuck top 51, is performed, and the wafer W on the chuck top 51 is returned to the cassette C in the port 20.

Further, during the inspection in one tester 40, the aligner 50 transfers a wafer W to another tester 40 or collects a wafer W from another tester 40.

Next, an example of a method of manufacturing the contactor 80 will be described.

(Fixing of the Card Main Body and the FPC Board)

First, the FPC board 82 is aligned and fixed to the card main body 81 having the recesses 81*b* by bonding or the like.

(Formation of Barrier Metal)

Next, conductive under barrier metals are formed on the electrode pads 82*a* of the FPC board 82. Specifically, for example, first, a mask is formed by a photolithography technique or the like to expose the electrode pads 82*a*. Then, the under barrier metals to be in contact with the spherical contact members 83 to be formed in a subsequent step are formed on the electrode pads 82*a* exposed through the mask. The under barrier metal can be formed by, e.g., an electroplating method or the like.

(Formation of Contact Member)

Next, the spherical contact members 83 made of solders are respectively formed on the under barrier metals. The spherical contact members 83 are collectively formed by electroplating, ball mounting, screen printing or the like. After the contact members 83 are formed, the mask is removed.

Accordingly, the contactor 80 is completely formed. The FPC board 82 and the card main body 81 may be fixed after the spherical contact members 83 are formed on the FPC board 82.

As described above, in the present embodiment, the contactor 80 having the spherical contact members 83 to be in contact with the wafer W includes the card main body 81 having the recesses 81*b* on the surface thereof opposed to the wafer W, and the flexible FPC board 82 that covers the recesses 81*b* to form the sealed spaces S. The card main body 81 includes the gas exhaust passage 81*c* and the air supply passage 81*d* provided for each of the sealed spaces S to adjust the pressure in each of the sealed spaces S, and the spherical contact members 83 are disposed to be opposed to the recesses 81*b* with the FPC board 82 interposed therebetween. Since the contactor 80 can be rapidly manufactured by the above-described manufacturing method or the like, the manufacturing cost can be reduced compared to the conventional electrical connecting device such as the probe card having the probe disclosed in Japanese Patent Application Publication No. 2004-85260. Especially, even when there are a number of spherical contact members 83, the contactor 80 can be manufactured in a short period of time.

Further, in the present embodiment, the spherical contact members 83 are supported by the FPC board 82, and thus are brought into elastic contact with the electrode pads Wp of the wafer W. Therefore, similarly to the conventional probes, the spherical contact members 83 can be brought into stable contact with the electrode pads Wp of the wafer W at an appropriate pressure.

Further, in the present embodiment, the spherical contact members 83 repeatedly collide with the electrode pads Wp of the wafer W, so that the insulating layers N on the corresponding electrode pads Wp are destroyed and the electrical connection between the electrode pads Wp and the spherical contact members 83 is ensured.

Conventionally, a large load is applied to the probes to destroy the insulating layers on the electrode pads and to ensure electrical connection between the electrode pads and the probes. However, the conventional method of applying the large load to the probes to ensure the electrical connection between the electrode pads and the probes has the following problems when the probe card has a plurality of probes. That is, the load cannot be adjusted for each probe, and thus is adjusted for each probe card. Therefore, when the probe card is tilted, the load applied to the probes may be different depending on the positions of the probes. Accordingly, in the case of deriving the condition for a set load for ensuring the electrical connection between all the probes and the electrode pads, it is necessary to check the state of the probes whenever the load is changed. Thus, a long period of time is required to derive the condition for the set load. Further, if an excessive load is applied to the probes, the electrode pads may be damaged by the probes and, thus, it is difficult to simply increase the set load.

On the other hand, in the method of ensuring electrical connection by repeating the collision between the spherical contact members 83 and the insulating layers N as in the present embodiment, the relationship between one electrode pad Wp and one spherical contact member 83 is examined to determine the set number of collisions and margin for ensuring the electrical connection. At this time, since only one spherical contact member 83 of the plurality of spherical contact members 83 is used to determine the set number of collisions, the conditions for the set number of collisions are quickly derived. Further, even when the set number of collisions quickly determined using one spherical contact member 83 is applied to other spherical contact members 83, the electrical connection between other spherical contact members 83 and the electrode pads Wp to be in contact therewith can be reliably ensured without destroying the corresponding electrode pads Wp.

Further, in the present embodiment, the insulating layers N are destroyed by repeating the collision between the spherical contact members 83 and the insulating layers N. Therefore, even if the load applied to the spherical contact members 83 is small, the electrical connection between the electrode pads Wp and the spherical contact members 83 can be ensured. For example, even if the load applied to the spherical contact members 83 is smaller than or equal to half of the load applied to the probes that are the conventional contact members, the electrical connection between the spherical contact members 83 and the electrode pads Wp can be reliably obtained. Therefore, the structure (e.g., the chuck top 51 or the like) that receives the load of the spherical contact members 83 does not require high rigidity, which makes it possible to realize downscaling and cost reduction of the structure. Accordingly, a small and low-priced inspection apparatus can be obtained.

Further, in the present embodiment, the load applied to the spherical contact members 83 is small, so that the damage to the electrode pads Wp due to the contact with the spherical contact members 83 is small.

Further, in the method of ensuring electrical connection with the electrode pads Wp of the wafer W as in the present embodiment, the electrical connection can be ensured more reliably compared to the conventional method, and the damage to the electrode pads Wp is small as described above. Therefore, it is possible to omit needle mark inspection performed in the case of using the probes.

Further, a common device may be provided for the gas exhaust device 102 of the gas exhaust mechanism 100 for adjusting the pressures in the sealed spaces S and the gas exhaust device of the gas exhaust mechanism for coupling the chuck top 51 by vacuum attraction force. Further, when a dry air supply source is necessary for the dechucking of the chuck top 51, a common source may be provided for the dry air supply source for dechucking the chuck top 51 and the dry air supply source 112 of the air supply mechanism 110 for adjusting the pressures in the sealed spaces S.

In the above described embodiment, the load applied to the spherical contact members 83 at the time of the electrical characteristic inspection is adjusted by the pressures in the sealed spaces S. However, the load may be adjusted by the pressure in the inspection space defined by the chuck top 51, the pogo frame 70, and the like.

Further, in the above described embodiment, when the spherical contact members 83 are made to collide with the insulating layers N on the electrode pads Wp of the wafer W to destroy the insulating layers N, dry air is supplied into the sealed spaces S. However, the sealed spaces S may be simply opened to the atmosphere.

When it is unnecessary to supply dry air into the sealed spaces S, the dry air supply source 112 of the air supply mechanism 110 is omitted and the end of the supply line 111 opposite to the end connected to the contactor 80 is opened to the atmosphere of a clean room.

A gas such as an inert gas or the like may be used instead of dry air.

As described above, the temperature of the chuck top 51 is adjusted. The temperature of the FPC board 82 is changed by the temperature of the chuck top 51. Further, the flexibility of the FPC board 82 is changed by the temperature of the FPC board 82. Therefore, the pressures in the sealed spaces S at the time of making the spherical contact members 83 collide with the insulating layers N or at the time of bringing the spherical contact members 83 into contact with the electrode pads Wp for the electrical characteristic inspection may be corrected depending on the temperature of the chuck top 51 or the like.

In the above described embodiment, the pressures in the sealed spaces S are controlled collectively. However, the pressures in the sealed spaces S may be controlled individually. Further, the spherical contact members 83 of the contactor 80 may be divided into groups, a gas exhaust mechanism may be provided for each group so that the pressures in the sealed spaces S can be controlled for each group.

In the above described embodiment, the FPC board using polyimide as a base material is used as the flexible portion. However, the flexible portion is not limited to the FPC board, and a flexible conductive path for electrical connection between an electrical connection source and an electrical connection destination through the contact member may be formed.

In the above described embodiment, the insulating layers N are destroyed by repeating the collision between the spherical contact members 83 and the insulating layers N. However, the insulating layers N may be destroyed by making the spherical contact members 83 collide with the insulating layers N once. Alternatively, the insulating layers N may be destroyed by setting the pressures in the sealed spaces S to a high level and applying a large load to the spherical contact members 83, instead of using the collision between the spherical contact members 83 and the insulating layer N.

In the above described embodiment, the technique of the present disclosure is applied to the contactor. However, the technique of the present disclosure may be applied to another connecting device having a connection terminal to be connected to a connection target. For example, the technique of the present disclosure may be applied to the pogo frame in the inspection apparatus. When the technique of the present disclosure is applied to the pogo frame, the pogo pins function as the spherical contact members supported by the FPC board.

Further, in the above described embodiment, the spherical contact member is used as the contact member. However, the contact member may have a columnar shape or a conical shape. When the contact member has a columnar shape or a conical shape and is made of, e.g., copper or nickel, a plurality of contact members can be collectively formed by etching, plating, or the like.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

Further, the following configurations are included in the technical scope of the present disclosure.

(1) An electrical connecting device having one or more contact members to be in contact with a contact target, the electrical connecting device includes: a main body having one or more recesses on a surface thereof opposed to the contact target; and a flexible portion that covers the recesses to form sealed spaces. The main body includes a gas exhaust passage and an air supply passage provided for each of the sealed spaces to adjust a pressure in each of the sealed spaces, and the contact members are respectively disposed to be opposed to the recesses with the flexible portion interposed therebetween.

In accordance with the configuration (1), it is possible to reduce the manufacturing cost of the electrical connecting device having the contactor to be in contact with the contact target.

(2) In the electrical connecting device of the configuration (1), contact and non-contact between the contact members and the contact target may be switched depending on deformation of the flexible portion due to the adjustment of the pressure in each of the sealed spaces.

(3) An inspection apparatus for inspecting an inspection target substrate, includes: a substrate support on which the inspection target substrate is supported, and the electrical connecting device described in the configuration (1) or (2).

(4) In the inspection apparatus of the configuration (3), the contact members of the electrical connecting device may be brought into contact with electrodes of the inspection target substrate.

(5) The inspection apparatus of the configuration (4) further includes: a controller configured to control a pressure adjusting mechanism connected to the gas exhaust passage and the air supply passage and configured to adjust the pressure in each of the sealed spaces.

(6) In the inspection apparatus of the configuration (5), the controller may control the pressure adjusting mechanism such that the contact members repeatedly collide with the electrodes.

(7) There is provided a method for electrically connecting a contact member and a contact target covered with an insulating layer in an electrical connecting device including the contact member, a main body having a recess on a surface thereof opposed to the contact target, and a flexible portion that covers the recess to form a sealed space, the contact member being disposed to be opposed to the recess with the flexible portion interposed therebetween. The method includes: adjusting a pressure in the sealed space and destroying the insulating layer that covers the contact target by making the contact member repeatedly collide with the insulating layer; and adjusting a pressure in the sealed space and electrically connecting the contact target and the contact member by bringing the contact member into contact with the contact target in a state where the insulating layer is destroyed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An electrical connecting device comprising:
a plurality of contact members to be in contact with a contact target;
a main body having a plurality of recesses on a surface thereof opposed to the contact target; and
a flexible portion that covers the plurality of recesses to form sealed spaces,
wherein the main body includes a gas exhaust passage and an air supply passage provided for each of the sealed spaces to adjust a pressure in each of the sealed spaces,
the plurality of contact members are respectively disposed to be opposed to the plurality of recesses with the flexible portion interposed therebetween, and
the plurality of contact members are formed on the flexible portion at positions corresponding to the plurality of recesses.

2. The electrical connecting device of claim 1, wherein contact and non-contact between the contact members and the contact target are switched depending on deformation of the flexible portion due to the adjustment of the pressure in each of the sealed spaces.

3. An inspection apparatus for inspecting an inspection target substrate, comprising:
a substrate support on which the inspection target substrate is supported, and
the electrical connecting device described in claim 1.

4. An inspection apparatus for inspecting an inspection target substrate, comprising:
a substrate support on which the inspection target substrate is supported, and
the electrical connecting device described in claim 2.

5. The inspection apparatus of claim 3, wherein the contact members of the electrical connecting device are brought into contact with electrodes of the inspection target substrate.

6. The inspection apparatus of claim 5, further comprising:
a controller configured to control a pressure adjusting mechanism connected to the gas exhaust passage and the air supply passage and configured to adjust the pressure in each of the sealed spaces.

7. The inspection apparatus of claim 6, wherein the controller controls the pressure adjusting mechanism such that the contact members repeatedly collide with the electrodes.

8. A method for electrically connecting an electrical connecting device and a contact target covered with an insulating layer; the electrical connecting device including a plurality of contact members, a main body having a plurality of recesses on a surface thereof opposed to the contact target, and a flexible portion that covers the plurality of recesses to form sealed spaces, wherein the plurality of contact members are respectively disposed to be opposed to the plurality of recesses with the flexible portion interposed therebetween, and the plurality of contact members are formed on the flexible portion at positions corresponding to the plurality of recesses, the method comprising:

adjusting a pressure in each of the sealed spaces and destroying the insulating layer that covers the contact target by making the contact members repeatedly collide with the insulating layer; and adjusting a pressure in each of the sealed spaces and electrically connecting the contact target and the contact members by bringing the contact members into contact with the contact target in a state where the insulating layer is destroyed.

\* \* \* \* \*